United States Patent
Selcuk

(10) Patent No.: US 6,306,738 B1
(45) Date of Patent: Oct. 23, 2001

(54) MODULATION OF GATE POLYSILICON DOPING PROFILE BY SIDEWALL IMPLANTATION

(75) Inventor: Asim Selcuk, Cupertino, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/334,926

(22) Filed: Jun. 17, 1999

(51) Int. Cl.[7] ............... H01L 21/3205; H01L 21/4763
(52) U.S. Cl. ............................. 438/525; 438/585
(58) Field of Search .................. 438/585, 302, 438/525

(56) References Cited

U.S. PATENT DOCUMENTS

| | | | |
|---|---|---|---|
| 4,714,519 | * | 12/1987 | Pfiester . |
| 4,745,079 | * | 5/1988 | Pfeister . |
| 5,360,751 | * | 11/1994 | Lee . |
| 5,516,707 | * | 5/1996 | Loh et al. . |
| 5,804,496 | * | 9/1998 | Duane .................................. 438/520 |

\* cited by examiner

*Primary Examiner*—Richard Booth

(57) ABSTRACT

A device and method to modulate a gate polysilicon doping profile by performing a sidewall implantation. The method includes forming a gate on a substrate and implanting ions through a sidewall in the gate. The ion implantation is performed by projecting the ions at an angle that is not perpendicular to the top surface of substrate and in a direction that is towards the surface of sidewall. The ion implantation process can be performed using a type of dopant that either increases or decreases the net dopant concentration in a gate polysilicon layer in a region of the gate adjacent the sidewall and adjacent a gate oxide layer.

5 Claims, 3 Drawing Sheets

MODULATION OF GATE POLYSILICON DOPING PROFILE BY SIDEWALL IMPLANTATION

FIELD OF THE INVENTION

The present invention relates to high-density semiconductor devices, and in particular, to a method for modulating a gate polysilicon doping profile by performing a sidewall implantation.

BACKGROUND OF THE INVENTION

Typical metal-oxide semiconductor (MOS) transistors include a gate formed on a silicon substrate. The gate typically includes an insulating layer, such as an oxide layer, that separates the silicon substrate from a heavily doped conductor, such as a polysilicon layer. Conventionally, the gate is formed such that the polysilicon layer has a uniform conductivity across the width of the gate by providing the polysilicon layer with a uniform doping profile across the width of the gate. Source and drain regions are formed in the substrate beneath the gate and are separated by a channel region. The oxide layer prevents current from flowing from the source region to the drain region through the gate until an input voltage reaches a threshold voltage.

Conventional construction of MOS transistors, namely the uniform doping profile of MOS transistors, restricts the ability of the gate to operate in an optimal manner. For example, by modifying the doping profile of the polysilicon layer across the width of the gate, a gate can be produced that provides increased current flow and/or reduced off-leakage and parasitic capacitance in the source region or drain region asymmetrically as compared to a conventional gate having a uniform doping profile. Additionally, by varying the gate doping profile the work function, localized threshold voltage, and overlap capacitance of the gate can be modified as needed when designing the performance characteristics of the gate.

There is a need for improved methods for modulating a gate doping profile to provide a gate having desired performance characteristics.

SUMMARY OF THE INVENTION

The present invention provides a device and method to optimize the performance characteristics of a gate. The invention achieves this result by modulating a gate polysilicon doping profile by performing a sidewall implantation to form a gate having desired performance characteristics. By allowing a designer to achieve desired performance characteristics, the present invention provides a method to optimize the performance characteristics for a specific gate electrode layout.

The method for modulating a gate polysilicon doping profile includes forming a gate on a substrate. Typically, the substrate is made of silicon and the gate includes an oxide layer deposited on a top surface on the substrate, and a polysilicon layer formed on a top surface of the gate oxide layer. The method includes forming a mask over the oxide layer and a portion of the top surface of the gate, such that a sidewall of the gate is exposed by a gap in the mask. Note that the formation of the mask may not be necessary if the later ion implantation process is performed in a precise manner such that the ion implantation is concentrated on the sidewall of the gate. In this instance it is best if an oxide layer is formed on the top of the polysilicon layer prior to etching the gate to prevent the implant from getting on top of the polysilicon layer.

The method further includes implanting ions in the gate through the sidewall and into the polysilicon layer. The ion implantation is preferably performed by projecting the ions at an angle that is not perpendicular to the top surface of substrate and in a direction that is towards the surface of sidewall. The ion implantation can be performed at any angle between zero and ninety degrees from a line perpendicular to the top surface of the substrate, with forty-five degrees being the preferred angle. The ion implantation process can be performed using a type of dopant that either increases or decreases the net dopant concentration in the polysilicon layer in a region of the gate adjacent the sidewall and adjacent a gate oxide layer.

The ions are driven within the polysilicon layer such that implanted ions are positioned in a region extending inward from the sidewall by a distance of no more than fifty percent of a width of the gate. Once the ion implantation is completed, the mask is removed using any suitable process so that the gate can be further processed as necessary. Once the ions are implanted within the gate and the desired doping profile is achieved, care must be taken to select subsequent implant drives so as not to drive the dopant from the intended location.

Additional advantages and other features of the invention will be set forth in part in the description which follows and in part will become apparent to those having ordinary skill in the art upon examination of the following or may be learned from the practice of the invention. The advantages of the invention may be realized and obtained as particularly pointed out in the appended claims.

DETAILED DESCRIPTION OF THE INVENTION

The present invention advantageously provides a device and method to optimize the performance characteristics of a gate. The invention achieves this result by modulating a gate polysilicon doping profile by performing a sidewall implantation.

Figure 1A:
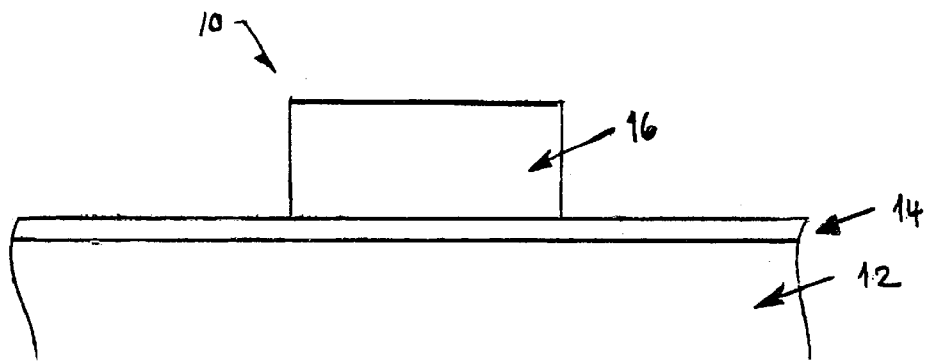
FIG. 1A is a cross-sectional, side view of a semiconductor device according to the present invention depicting a gate formed on a substrate.
Figure 1B:
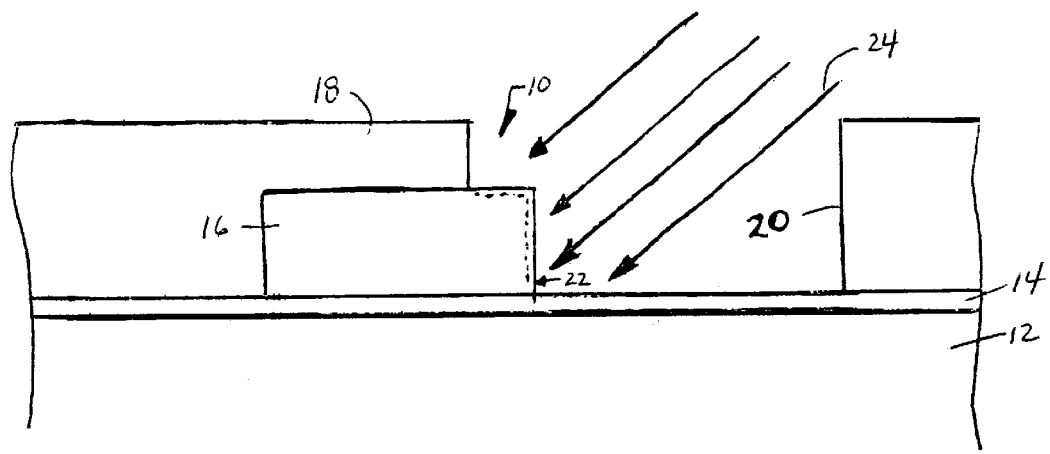
FIG. 1B is a cross-sectional, side view of a semiconductor device according to the present invention depicting a mask with a gap formed on the substrate and the gate and depicting an angled ion implantation process on a sidewall of the gate.
Figure 1C:
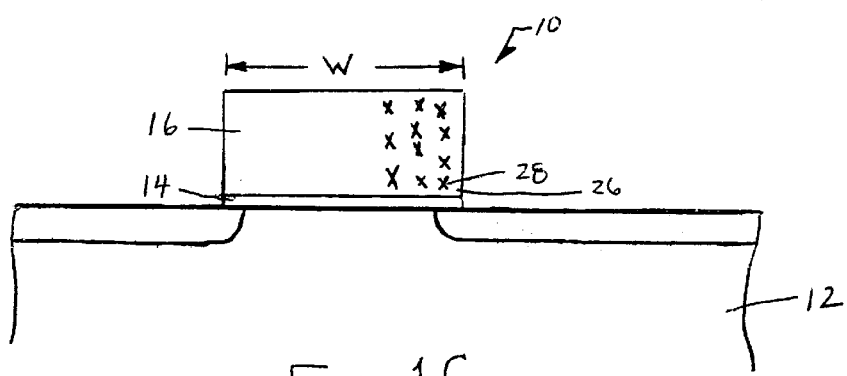
FIG. 1C is a cross-sectional, side view of a semiconductor device according to the present invention depicting the gate with the mask removed therefrom.

FIGS. 1A–1C depict a semiconductor device of the present invention at various stages along the manufacturing process. FIG. 1A is a cross-sectional view of a semiconductor substrate 12 upon which a CMOS device will be fabricated. The substrate 12 is made of silicon and has a gate 10 formed thereon. The gate 10 includes an oxide layer 14 deposited or grown on a top surface on the substrate 12, and a polysilicon layer 16 formed on a top surface of the gate oxide layer 14. The gate 10 is constructed using any suitable processing method. In FIG. 1A the polysilicon layer 16 of the gate 10 is etched while the oxide layer 14 is not etched until later in the process.

FIG. 1B depicts the gate 10 with a photoresist mask 18 formed on a portion of a top surface of the polysilicon layer 16 and on an upper surface of the oxide layer 14. The mask 18 has a gap 20 therein that is configured to expose a sidewall 22 of the gate 10. Note that the gap 20 also partially exposes the top surface of the polysilicon layer 16. The amount of exposure of the polysilicon layer 16 should be minimized in order to better control the lateral polysilicon doping profile discussed below. FIG. 1B depicts the gate 10 having ions 24 implanted through the sidewall 22 and into the polysilicon layer 16. The gap 20 in the mask 18 allows the ions 24 to be implanted through the sidewall 22, while the mask 18 and the oxide layer 14 prevent the implantation of ions 24 in those areas covered by the mask 18 and the oxide layer 14. The oxide layer 14 prevents unwanted ion implantation in the silicon substrate 12.

The ion implantation is preferably performed by projecting the ions 24 at an angle that is not perpendicular to the top surface of substrate 12 and in a direction that is towards the surface of sidewall 22. The ion implantation can be angled by tilting an ion beam projector that is directing the ions on to the gate or by tilting the wafer while the ion beam projector is held in a fixed position or by tilting both the ion beam projector and the wafer. The ion implantation can be performed at any angle between zero and ninety degrees from a line perpendicular to the top surface of the substrate 12, with forty-five degrees being the preferred angle. The ion implantation process can be performed using a type of dopant that has an electrical charge that is identical to an original dopant used in the formation of the gate 10, thereby increasing the net dopant concentration on the side of the gate 10 adjacent sidewall 22 (see FIG. 2A). Alternatively, the ion implantation process can be performed using type of dopant that has an electrical charge that is opposite to the original dopant used in the, formation of the gate 10, thereby decreasing the net dopant concentration on the side of the gate 10 adjacent sidewall 22 (see FIG. 2B). The ion implantation can be performed using any suitable material depending upon the desired result, as will be readily apparent to one of ordinary skill in the art. The ion implantation process is performed with an appropriate dose and energy such that the source and drain regions and the gate are not affected but there is enough dopant in the polysilicon sidewall to cause an appropriate shift in polysilicon doping.

FIG. 1C depicts the gate 10 with the oxide layer 14 etched and the source and drain regions formed in the substrate 12. The ions 24 are driven within the polysilicon layer 16 such-that implanted ions 28 are positioned in a region extending inward from the sidewall 22 by a distance of no more than fifty percent of a width W of the gate 10, as depicted in FIG. 1C. Preferably, the region of increased or decreased net dopant concentration extends, inward from the sidewall 22 by a distance within a range of about twenty-five percent to about fifty percent of the width W of the gate 10. Once the ion implantation is completed, the mask 18 is removed using any suitable process and the gate 10 can be further processed as necessary. Once the ions are implanted within the gate 10 and the desired doping profile is achieved, care must be taken to select subsequent implant drives so as not to drive the dopant from the intended location.

A region of particular importance to the present invention is a region 26 in the polysilicon layer 16 of the gate 10. The region 26 is located adjacent the gate sidewall 22 and adjacent the top surface of the gate oxide layer 14. By modulating the doping profile of the polysilicon layer 16 at region 26, the performance characteristics of the gate 10 can be controlled by defining the interaction between the polysilicon layer 16, the gate oxide layer 14 and an active region underlying sidewall 22 of the gate 10. The type and amount of dopant used and the distance at which the dopant is driven within the gate 10 are directly dependent upon the gate performance characteristics desired, as will be readily apparent to one of ordinary skill in the art.

The oxide layer 14 prevents the ion implantation of the substrate 12 and any implantation regions formed therein, such as source regions, drain regions, and channel regions. The mask 18 helps control the amount of dopant that is implanted within the polysilicon layer 16. The mask 18 may not necessary if the ion implantation process is performed in a precise manner such that the ion implantation is concentrated on the sidewall 22 of the gate 10.

Figure 2A:
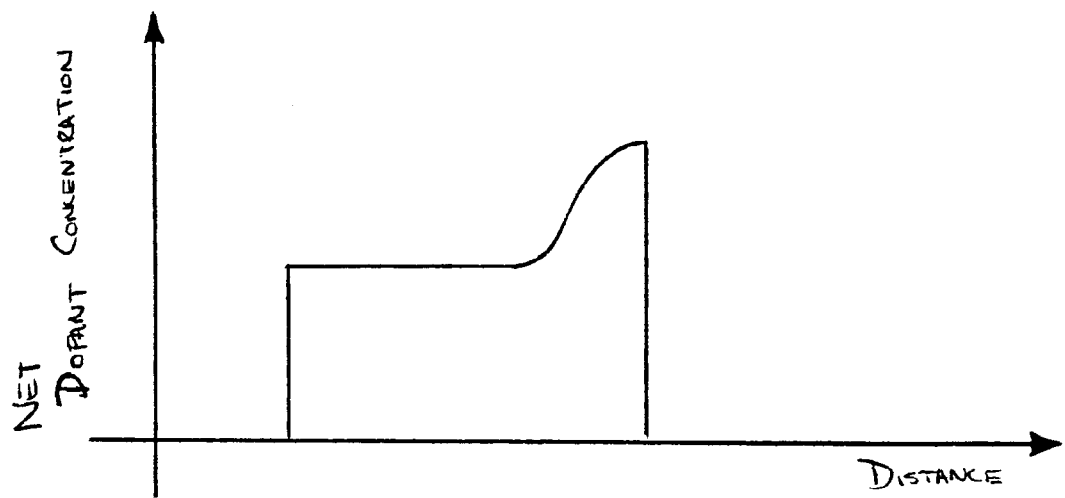
FIG. 2A is a graph of a doping concentration profile over an entire width of the gate depicted in FIG. 1C where the ion implantation process uses a dopant that is of an identical electrical charge as an original dopant used in the formation of the gate.
Figure 2B:
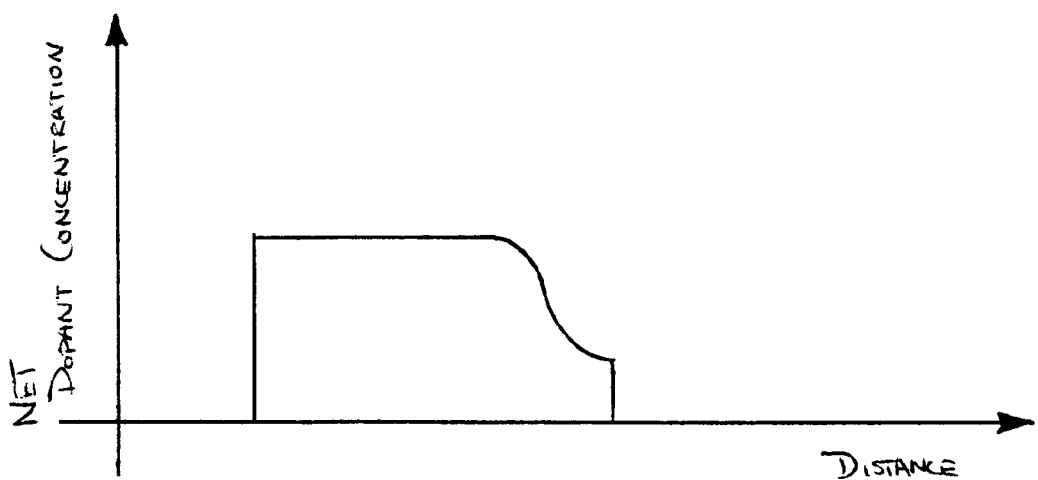
FIG. 2B is a graph of a doping concentration profile over an entire width of the gate depicted in FIG. 1C where the ion implantation process uses a dopant that is of an opposite electrical charge as an original dopant used in the formation of the gate.

The present invention provides an ion implantation that creates a doping profile that is unequal or non-uniform along the width W of the polysilicon layer 16. FIG. 2A is a graph of a doping concentration profile over an entire width of the gate where the ion implantation process uses a dopant that is of an identical electrical charge as an original dopant used in the formation of the gate. The doping profile depicted in FIG. 2A has an increased net dopant concentration on the side of the gate 10 adjacent sidewall 22. FIG. 2B is a graph of a doping concentration profile over an entire width of the gate where the ion implantation process uses a dopant that is of an opposite electrical charge as an original dopant used in the formation of the gate. The doping profile depicted in FIG. 2B has a decreased net dopant concentration on the side of the gate 10 adjacent sidewall 22.

Figure 3:
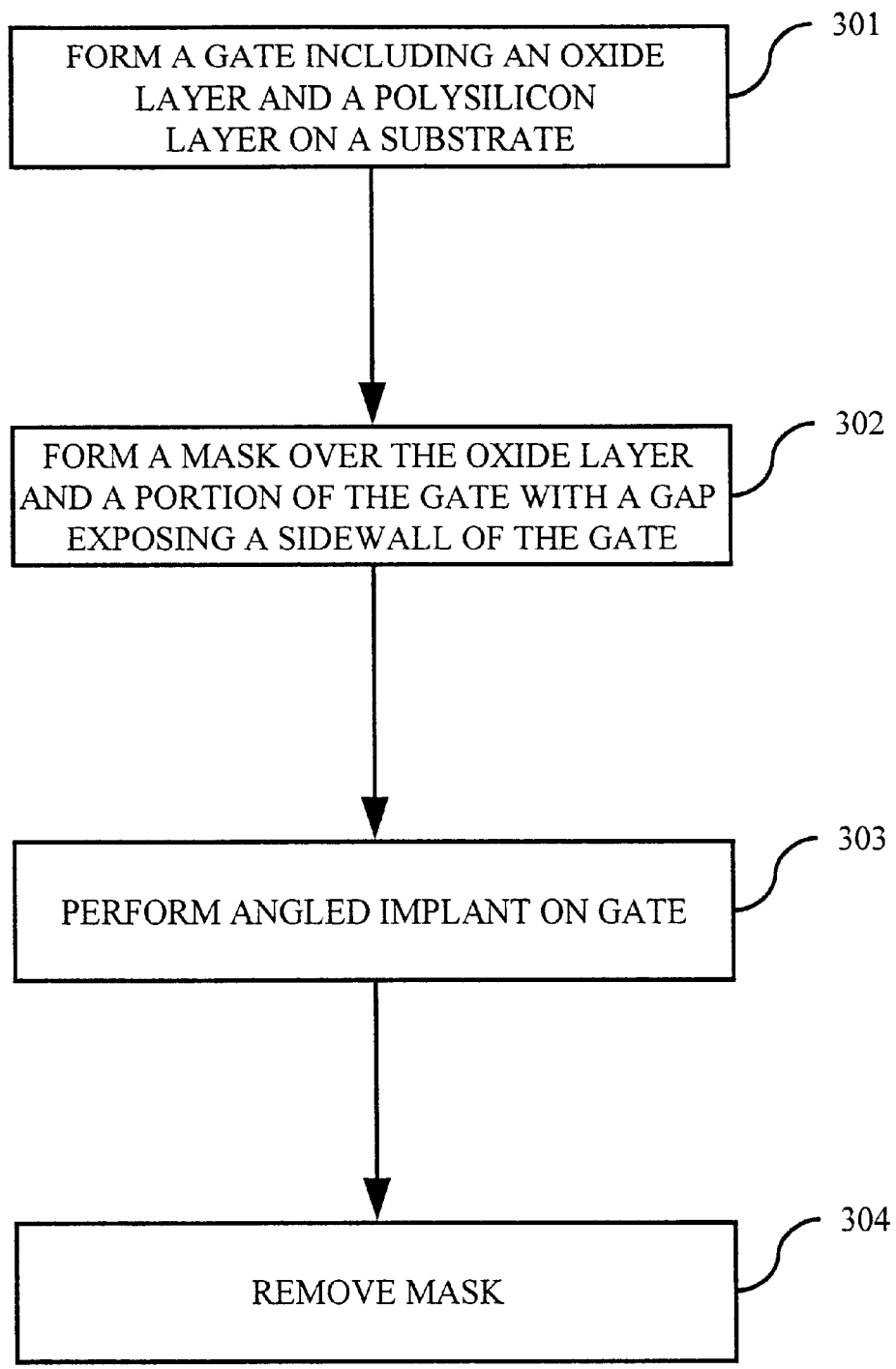
FIG. 3 is a flowchart of a method for modulating a gate polysilicon doping profile by performing a sidewall implantation according to the present invention.

FIG. 3 depicts a flowchart of a method for modulating a gate polysilicon doping profile by performing a sidewall implantation according to the present invention. The method for modulating a gate polysilicon doping profile includes a step 301 of forming a gate including an oxide layer and a polysilicon layer on a substrate. Typically, the substrate is made of silicon and the gate includes an oxide layer deposited on a top surface on the substrate, and a polysilicon layer formed on a top surface of the gate oxide layer. The gate is constructed using any suitable processing method. The method further includes a step 302 of forming a mask over the oxide layer and a portion of the top surface of the gate, wherein the mask includes a gap exposing a sidewall of the gate. The mask can be constructed using any suitable method. Step 302 of forming the mask may not be necessary if the later ion implantation process is performed in a precise manner such that the ion implantation is concentrated on the sidewall of the gate.

The method includes a step 303 where ions are implanted in the gate through the sidewall and into the polysilicon layer. The ion implantation is preferably performed by projecting the ions at an angle that is not perpendicular to the top surface of substrate and in a direction that is towards the surface of sidewall. The ion implantation can be performed at any oblique angle between zero and ninety degrees from a line perpendicular to the top surface of the substrate, with forty-five degrees being the preferred angle. As discussed above, the ion implantation process can be performed using a type of dopant that has an electrical charge that is identical to an original dopant used in the formation of the gate, thereby increasing the net dopant concentration on the side of the gate adjacent sidewall. Alternatively, the ion implantation process can be performed using a type of dopant that has an electrical charge that is opposite to the original dopant used in the formation of the gate, thereby decreasing the net dopant concentration on the side of the gate adjacent sidewall. The ion implantation can be performed using any suitable material depending upon the desired result, as will be readily apparent to one of ordinary skill in the art.

Step 303 is performed by driving the ions within the polysilicon layer such that implanted ions are positioned in a region extending inward from the sidewall by a distance of no more than fifty percent of a width of the gate. Preferably, the region of increased or decreased net dopant concentration begins at the sidewall and extends inward from the sidewall by a distance within a range of about twenty-five percent to about fifty percent of a width of the gate. Once the ion implantation is completed step 304 is performed and the mask is removed using any suitable process so that the gate can be further processed as necessary. Once the ions are implanted within the gate and the desired doping profile is achieved, care must be taken to select subsequent implant drives so as not to drive the dopant from the intended location.

In order to systematically perform the above process, the devices that require asymmetry need to be identified in the circuit layout and oriented appropriately on the wafer. When the ion implantation process is performed, it will be performed in the orientation that results in the dopant being implanted on the correct side. Therefore, in order to efficiently perform a limited number of ion implantation for a given wafer it is advisable to orient the devices that require asymmetry in the same direction so that only a limited number of ion implantations are required.

The present invention advantageously provides an embodiment that allows for modulating a gate doping profile to provide a gate having desired performance characteristics. By allowing a designer to achieve desired performance characteristics, the present invention provides a method to optimize the performance characteristics for a specific gate electrode layout.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail in order not to unnecessarily obscure the present invention.

Only the preferred embodiment of the invention and an example of its versatility are shown and described in the present disclosure. It is to be understood that the invention is capable of use in various other combinations and environments and is capable of changes or modifications within the scope of the inventive concept as expressed herein.

What is claimed is:

1. A method for modulating a gate polysilicon doping profile of a metal-oxide semiconductor field effect transistor, said method comprising the steps of:

forming a gate on a substrate, the gate having a gate oxide layer formed on the substrate and an etched polysilicon layer formed on the gate oxide layer, the polysilicon layer having a top surface and opposed sidewalls;

forming a photoresist mask on a first portion of the top surface of the polysilicon layer and to entirely cover one sidewall, the entire other sidewall and a second portion of the top surface, less than the first portion, being exposed; and performing an angled ion implantation on the exposed sidewall and the exposed portion of the top surface of the polysilicon layer such that a doping profile of a region in the polysilicon layer adjacent the exposed sidewall and adjacent the gate oxide layer is unequal to a doping profile of a remainder of the polysilicon layer of the gate.

2. The method of claim 1, wherein the gate is doped using a dopant having an electrical charge during formation of the gate, and wherein the step of performing an angled ion implantation uses a dopant that is of an identical electrical charge as the dopant used in the formation of the gate.

3. The method of claim 1, wherein the gate is doped using, a dopant having an electrical charge during formation of the gate, and wherein the step of performing an angled ion implantation uses a dopant that is of an opposite electrical charge as the dopant used in the formation of the gate.

4. The method of claim 1, wherein the region in the polysilicon layer adjacent the sidewall of the gate and adjacent the gate oxide layer begins at the sidewall and extends inward from the sidewall by a distance of no more than fifty percent of a width of the gate.

5. The method of claim 4, wherein the region in the polysilicon layer adjacent the sidewall of the gate and adjacent the gate oxide layer begins at the sidewall and extends inward from the sidewall by a distance in a range of about twenty-five percent to about fifty percent of a width of the gate.

* * * * *